(12) United States Patent
Yanagida et al.

(10) Patent No.: US 7,870,757 B2
(45) Date of Patent: Jan. 18, 2011

(54) LIQUID DISCHARGE METHOD AND LIQUID DISCHARGER IN TEMPERATURE CONTROLLER

(75) Inventors: Akihito Yanagida, Nishitokyo (JP); Taichi Fujita, Mitaka (JP)

(73) Assignees: Sumitomo Heavy Industries, Ltd., Shinagawa-Ku, Tokyo (JP); Tokyo Seimitsu Co., Ltd., Mitaka-Shi, Tokyo (JP)

( * ) Notice: Subject to any disclaimer, the term of this patent is extended or adjusted under 35 U.S.C. 154(b) by 783 days.

(21) Appl. No.: 11/794,864

(22) PCT Filed: Feb. 16, 2007

(86) PCT No.: PCT/JP2007/052871

§ 371 (c)(1),
(2), (4) Date: Jul. 6, 2007

(87) PCT Pub. No.: WO2008/004352

PCT Pub. Date: Jan. 10, 2008

(65) Prior Publication Data

US 2010/0005815 A1    Jan. 14, 2010

(30) Foreign Application Priority Data

Jul. 4, 2006    (JP) .............................. 2006-184378

(51) Int. Cl.
*F25D 11/00* (2006.01)
(52) U.S. Cl. ................. 62/430; 62/77; 62/149
(58) Field of Classification Search .............. 62/77, 62/89, 149, 430
See application file for complete search history.

(56) References Cited

U.S. PATENT DOCUMENTS 4,484,452 A * 11/1984 Houser, Jr. .................... 62/174
6,220,041 B1 * 4/2001 Okazaki et al. ............... 62/149

FOREIGN PATENT DOCUMENTS

| JP | 07-251069 | 10/1995 |
|----|-----------|---------|
| JP | 11-249747 | 9/1999 |
| JP | 2001-004718 | 1/2001 |
| JP | 2002-124558 | 4/2002 |
| JP | 2002-353297 | 12/2002 |
| JP | 2003-148852 | 5/2003 |
| JP | 2005-089864 | 4/2005 |

* cited by examiner

*Primary Examiner*—Melvin Jones
(74) *Attorney, Agent, or Firm*—Squire, Sanders & Dempsey L.L.P.

(57) ABSTRACT

There is disclosed a liquid discharge method in a temperature controller having a refrigerant circulation line circulating a refrigerant to a target of temperature control and a heater heating the target, wherein the refrigerant is circulated so as to control the temperature of the target with the refrigerant and the heater in the case where the temperature of the target is controlled to be a first temperature lower than or equal to a room temperature, wherein the circulation of the refrigerant is stopped so as to control the temperature of the target with the heater in the case where the temperature of the target is controlled to be a second temperature higher than the room temperature, wherein in the case of changing the setpoint of the target from the first temperature to the second temperature.

7 Claims, 3 Drawing Sheets

FIG.3

| LIQUID DISCHARGE CONDITIONS (REFRIGERANT BOILING POINT 76°C) | RESIDUAL LIQUID AMOUNT |
|---|---|
| LIQUID DISCHARGE 1 MIN. @ HEAT TRANSFER PLATE 10°C | 11.0g |
| LIQUID DISCHARGE 3 MIN. @ HEAT TRANSFER PLATE 10°C | 1.0g |
| LIQUID DISCHARGE 5 MIN. @ HEAT TRANSFER PLATE 10°C | 0.8g |
| LIQUID DISCHARGE 1 MIN. @ HEAT TRANSFER PLATE 10°C + 1 MIN. @ HEAT TRANSFER PLATE 100°C | 0.0g |
| LIQUID DISCHARGE 1 MIN. @ HEAT TRANSFER PLATE 10°C + 2 MIN. @ HEAT TRANSFER PLATE 100°C | 0.0g |

LIQUID DISCHARGE METHOD AND LIQUID DISCHARGER IN TEMPERATURE CONTROLLER

TECHNICAL FIELD

The present invention relates generally to a temperature controller that controls the temperature of a target of temperature control such as a heat transfer plate by cooling by the refrigerant of a refrigerant circulator and heating by a heater, and more particularly to liquid discharge of the temperature controller.

BACKGROUND ART

In general, a conventional temperature controller for controlling the temperature of a target of temperature control such as a heat transfer plate controls the temperature of the target with a heater provided in the target, causing a refrigerant in a refrigerant circulation line to circulate in the case of controlling the temperature of the target so that the temperature is lower than or equal to room temperature, and stopping circulation of the refrigerant in the case of controlling the temperature of the target so that the temperature is higher than room temperature. By this method, the temperature of the target is controlled to be in the range of $-70°$ C. to $200°$ C., for example. FIG. 1 shows a conceptual flow diagram of a conventional temperature controller.

The temperature controller includes an open-to-atmosphere refrigerant tank 104, a refrigerator R' that cools a refrigerant 103 in the refrigerant tank 104, a target of temperature control (hereinafter referred to as "heat transfer plate P'") having its temperature controlled with the refrigerant 103 and a heat transfer plate heater 110, a refrigerant cooling line L1' that circulates the refrigerant 103 between the refrigerant tank 104 and the refrigerator R', and a refrigerant circulation line L2' that circulates the refrigerant 103 between the refrigerant tank 104 and the heat transfer plate P'.

The heat transfer plate P' includes a refrigerant passage 109 through which the refrigerant 103 circulating in the refrigerant circulation line L2' flows, and the heat transfer plate heater 110 that heats the heat transfer plate P'. The temperature of the heat transfer plate P' is controlled to be a predetermined setpoint by the refrigerant 103 flowing through the refrigerant passage 109 and the heat transfer plate heater 110. The heat transfer plate P' includes a heat transfer plate temperature sensor 110a for detecting the temperature of the heat transfer plate P' and controlling the heat transfer plate temperature heater 110 so that the temperature of the heat transfer plate P' equals the predetermined setpoint.

The refrigerator R' includes a compressor 101 and a heat exchanger 102. A circulation circuit in which a compressor-side refrigerant flows from the compressor 101 through the heat exchanger 102 to the compressor 101 in the arrow direction shown in FIG. 1 is formed in the refrigerator R'. The heat exchanger 102 includes a compressor-side refrigerant passage 102a through which the compressor-side refrigerant flows and a refrigerant passage 102b through which the refrigerant 103 in the refrigerant tank 104 flows. The refrigerant 103 in the refrigerant tank 104 flows through this refrigerant passage 102b to be cooled in the refrigerator R'.

The refrigerant cooling line L1' controls the temperature of the refrigerant 103 in the refrigerant tank 104 in accordance with the predetermined setpoint of the heat transfer plate P'. The refrigerant cooling line L1' includes the refrigerant passage 102b, the refrigerant tank 104, a circulating pump 105 that pumps the refrigerant 103 in the refrigerant tank 104 into the refrigerant passage 102b, and a flow control valve 106 that controls the flow rate of the refrigerant 103 flowing through the refrigerant cooling line L1'. As a result, the refrigerant 103 in the refrigerant tank 104 circulates from the refrigerant tank 104 through the circulating pump 105, the refrigerant passage 102b, and the flow control valve 106 to the refrigerant tank 104 in the refrigerant cooling line L1'.

The flow control valve 106 is controlled by a refrigerant temperature sensor 106a provided at the refrigerant tank 104. The flow control valve 106 controls the flow rate of the refrigerant 103 flowing through the refrigerant passage 102b, thereby controlling the temperature of the refrigerant 103 in the refrigerant tank 104 so that the temperature corresponds to the predetermined setpoint of the heat transfer plate P'.

The refrigerant circulation line L2' controls the temperature of the heat transfer plate P'. The refrigerant circulation line L2' includes the refrigerant passage 109 formed in the heat transfer plate P', the refrigerant tank 104, a circulation line pump 107 that pumps the refrigerant 103 in the refrigerant tank 104 into the refrigerant passage 109, and a circulation line heater 108. As a result, the refrigerant 103 in the refrigerant tank 104 circulates from the refrigerant tank 104 through the circulation line pump 107, the circulation line heater 108, and the refrigerant passage 109 to the refrigerant tank 104 in the refrigerant circulation line L2'.

The temperature controller thus configured operates as follows. In the case of controlling the temperature of the heat transfer plate P' so that the temperature is lower than or equal to room temperature, the refrigerator R' and the circulating pump 105 are operated to cause the refrigerant 103 in the refrigerant tank 104 to circulate in the refrigerant cooling line L1', and the flow rate of the refrigerant 103 flowing through the refrigerant passage 102b is controlled by the flow control valve 106 so that the temperature of the refrigerant 103 in the refrigerant tank 104 is controlled to correspond to the predetermined setpoint of the heat transfer plate P'.

At the same time, the circulation line pump 107 and the heat transfer plate heater 110 of the refrigerant circulation line L2' are operated so that the circulation line pump 107 pumps the refrigerant 103 in the refrigerant tank 104 into the refrigerant passage 109 of the heat transfer plate P' and the temperature of the heat transfer plate P' is controlled with the refrigerant 103 pumped into the refrigerant passage 109 and the heat transfer plate heater 110 provided in the heat transfer plate P'. The heat transfer plate heater 110 is controlled based on the temperature detected by the heat transfer plate sensor 110a so that the temperature of the heat transfer plate P' is equal to the predetermined setpoint. The refrigerant 103 pumped into the refrigerant passage 109 is returned to the refrigerant tank 104 after performing heat exchange with the heat transfer plate P'.

In the case of changing the setpoint of the heat transfer plate P' from a temperature lower than or equal to room temperature, for example, $-40°$ C., to a temperature higher than room temperature, for example, $200°$ C., the circulation line pump 107 is operated and the circulation line heater 108 and the heat transfer plate heater 110 are operated so as to raise the temperature of the refrigerant 103 circulating in the refrigerant circulation line L2'. At this point, the operation of the refrigerator R' and the circulating pump 105 is stopped. When the temperature of the refrigerant 103 in the refrigerant tank 104 has risen to a predetermined temperature, for example, $10°$ C. (where the refrigerant 103 remains liquid), the operation of the circulation line pump 107 is stopped to stop circulation of the refrigerant 103 in the refrigerant circulation line L2', and the operation of the circulation line heater 108 is stopped. After the temperature of the refrigerant 103 in the refrigerant tank 104 has risen to 10° C., the temperature of the heat transfer plate P' is raised by the heat transfer plate heater 110 to 200° C. Thereafter, the heat transfer plate heater 110 controls the temperature of the heat transfer plate P' so that the temperature equals the setpoint of 200° C. based on the temperature detected by the heat transfer plate temperature sensor 110a.

Prior-art documents regarding the temperature controller include the following Patent Document 1, and prior-art documents regarding the heat transfer plate include the following Patent Documents 2 and 3.

[Patent Document 1] Japanese Laid-Open Patent Application No. 2003-148852

[Patent Document 2] Japanese Laid-Open Patent Application No. 2002-124558

[Patent Document 3] Japanese Laid-Open Patent Application No. 2002-353297

DISCLOSURE OF THE INVENTION

Problems to be Solved by the Invention

In the case of controlling the temperature of the heat transfer plate P' to a high temperature, for example, 150° C. or higher, with the conventional temperature controller of the heat transfer plate configured as described above, even when the circulation line pump 107 stops circulation of the refrigerant 103, the refrigerant 103 remains in the refrigerant circulation line L2'. Therefore, the refrigerant 103 remaining in the refrigerant passage 109 of the heat transfer plate P' is heated to high temperature by the heat transfer plate heater 110. This may cause various problems such as generation of a poisonous gas from the refrigerant 103 due to its thermal decomposition, and oxidation and evaporation of the refrigerant 103, depending on the type and the temperature conditions of the refrigerant 103.

In particular, there is a problem in that a refrigerant that yields high performance in a low-temperature range (for example, at or below 0° C.) cannot be used, even when it is desired to use it, because of the above-described problem at the time of controlling the temperature of the heat transfer plate P' to high temperature. This narrows the range of selection of refrigerants to be used.

An object of the present invention is to widen the range of selection of refrigerants to be used by making it possible to control to high temperature a refrigerant that yields high performance in a low-temperature range by preventing the refrigerant from being oxidized, evaporated, or generating a poisonous gas at the time of changing the setpoint of a target of temperature control from a temperature lower than or equal to room temperature to a temperature higher than room temperature in a temperature controller having a refrigerant circulation line that circulates the refrigerant to the target and a heater that heats the target, where the temperature of the target is controlled with the refrigerant circulating in the refrigerant circulation line and the heater at the time of controlling the temperature of the target to low temperature, and circulation of the refrigerant is stopped and the temperature of the target is controlled with the heater at the time of controlling the temperature of the target to high temperature.

Means for Solving the Problems

Embodiments of the present invention may solve or reduce one or more of the above-described problems.

According to one embodiment of the present invention, there is provided a liquid discharge method and a liquid discharger in a temperature controller in which one or more of the above-described problems may be solved.

According to one embodiment of the present invention, there is provided a liquid discharge method in a temperature controller having a refrigerant circulation line circulating a refrigerant to a target of temperature control and a heater heating the target, wherein the refrigerant is circulated so as to control a temperature of the target with the refrigerant and the heater in a case where the temperature of the target is controlled to be a first temperature lower than or equal to a room temperature, wherein the circulation of the refrigerant is stopped so as to control the temperature of the target with the heater in a case where the temperature of the target is controlled to be a second temperature higher than the room temperature, wherein in a case of changing a setpoint of the target from the first temperature to the second temperature, when a temperature of the refrigerant rises to reach a first predetermined temperature lower than or equal to a boiling point of the refrigerant, the circulation of the refrigerant is stopped, one of air and an inert gas is fed to the refrigerant circulation line so as to discharge the refrigerant in the target, and simultaneously, the temperature of the target continues to be raised with the heater; and when the temperature of the target rises to reach a second predetermined temperature higher than the boiling point of the refrigerant, the one of the air and the inert gas is again fed to the refrigerant circulation line so as to discharge the refrigerant remaining in the target.

According to one embodiment of the present invention, there is provided a liquid discharger in a temperature controller having a refrigerant circulation line circulating a refrigerant to a target of temperature control and a heater heating the target, wherein the refrigerant is circulated so as to control a temperature of the target with the refrigerant and the heater in a case where the temperature of the target is controlled to be a first temperature lower than or equal to a room temperature, wherein the circulation of the refrigerant is stopped so as to control the temperature of the target with the heater in a case where the temperature of the target is controlled to be a second temperature higher than the room temperature, the liquid discharger including an air feed line connected to the refrigerant circulation line, wherein in a case of changing a setpoint of the target from the first temperature to the second temperature, when a temperature of the refrigerant rises to reach a first predetermined temperature lower than or equal to a boiling point of the refrigerant, the circulation of the refrigerant is stopped, one of air and an inert gas is fed from the air feed line to the refrigerant circulation line so as to discharge the refrigerant in the target, and simultaneously, the temperature of the target continues to be raised with the heater; and when the temperature of the target rises to reach a second predetermined temperature higher than the boiling point of the refrigerant, the one of the air and the inert gas is again fed from the air feed line to the refrigerant circulation line so as to discharge the refrigerant remaining in the target.

Effects of the Invention

According to a liquid discharge method and a liquid discharger in a temperature controller according to one embodiment of the present invention, in the case of changing the setpoint of a target of temperature control from a temperature lower than or equal to room temperature to a temperature higher than room temperature, it is possible to remove all of a refrigerant in the target by performing liquid discharge at two stages: stopping circulation of the refrigerant in a refrigerant circulation line and causing air or an inert gas such as nitrogen to flow through the refrigerant circulation line so as to discharge the refrigerant in a liquid state in the target when the temperature of the target has risen to a first predetermined temperature lower than or equal to the boiling point of the refrigerant; and thereafter, again causing air or an inert gas such as nitrogen to flow through the refrigerant circulation line so as to discharge the vaporized refrigerant remaining in the target when the temperature of the target has risen to a second predetermined temperature higher than the boiling point of the refrigerant. Therefore, at the time of controlling the temperature of the target to high temperature, the refrigerant is prevented from being evaporated, oxidized, or generating a poisonous gas. Further, it is possible to control a refrigerant that yields high performance in a low-temperature range to high temperature, so that it is possible to widen the range of selection of refrigerants to be used, and to reduce cooling time and increase refrigeration capacity.

BRIEF DESCRIPTION OF THE DRAWINGS

Other objects, features and advantages of the present invention will become more apparent from the following detailed description when read in conjunction with the accompanying drawings, in which:

FIG. 3 is a table showing a comparison in a test according to the embodiment of the present invention.

DESCRIPTION OF REFERENCE NUMERALS

Figure 1:
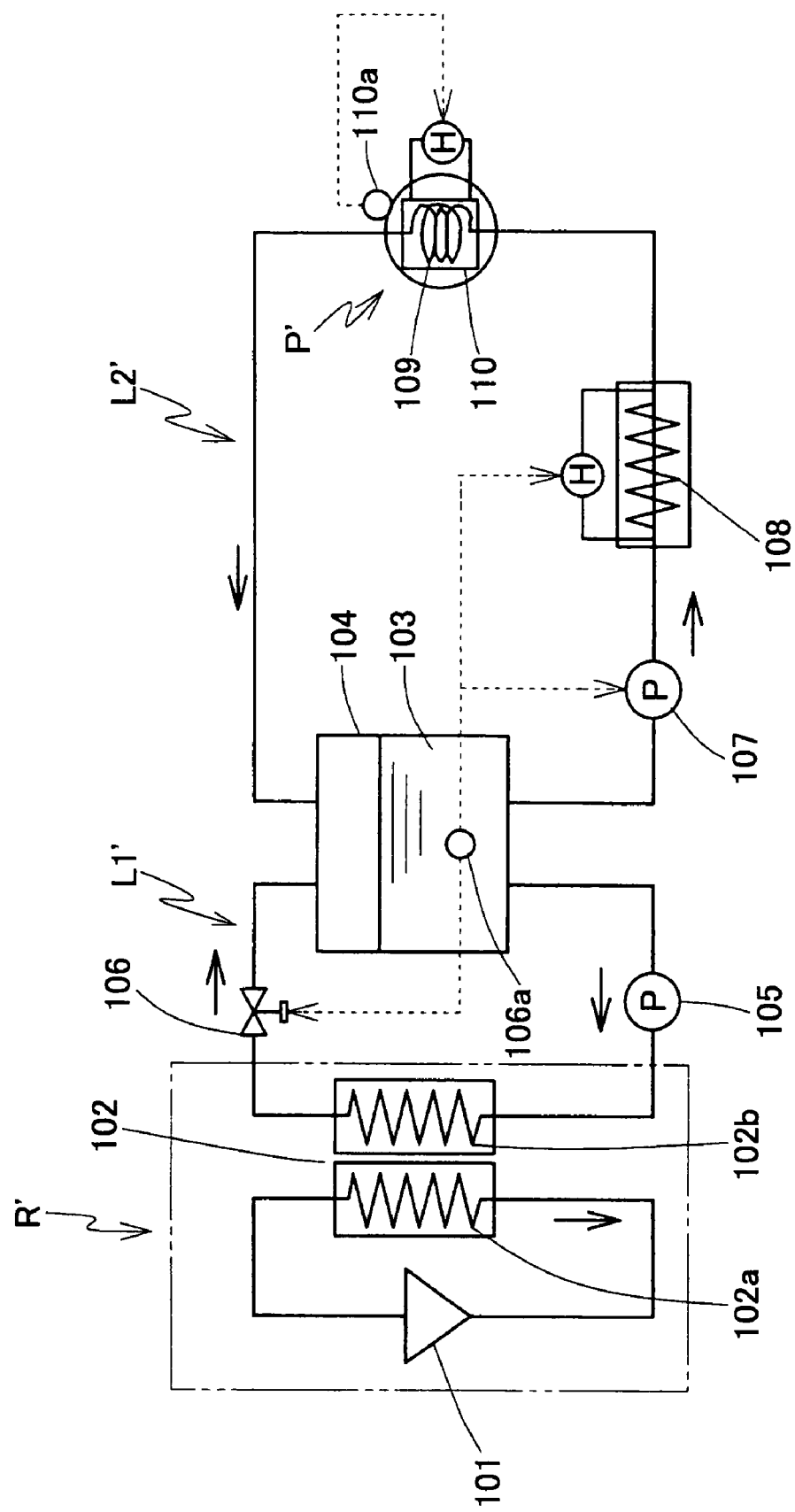
FIG. 1 is a conceptual flow diagram of a conventional temperature controller.

P Heat transfer plate
R Refrigerator
L1 Refrigerant cooling line
L2 Refrigerant circulation line
E Liquid discharger
CR1 Flow control valve control part
CR2 Heat transfer plate heater control part
CR3 Circulation line pump control part
CR4 Circulation line heater control part
CR5 Liquid discharge valve control part
CR6 Heat transfer plate heater stop control part
1 Compressor
2 Heat exchanger
3 Refrigerant
4 Refrigerant tank
5 Circulating pump
6 Flow control valve
6a Refrigerant temperature sensor
7 Circulation line pump
8 Circulation line heater
9 Refrigerant passage of the heat transfer plate P
10 Heat transfer plate heater
10a Heat transfer plate temperature sensor
11 Air feed source
12 Air feed line
13 Liquid discharge valve
14 Flow switch

BEST MODE FOR CARRYING OUT THE INVENTION

Figure 2:
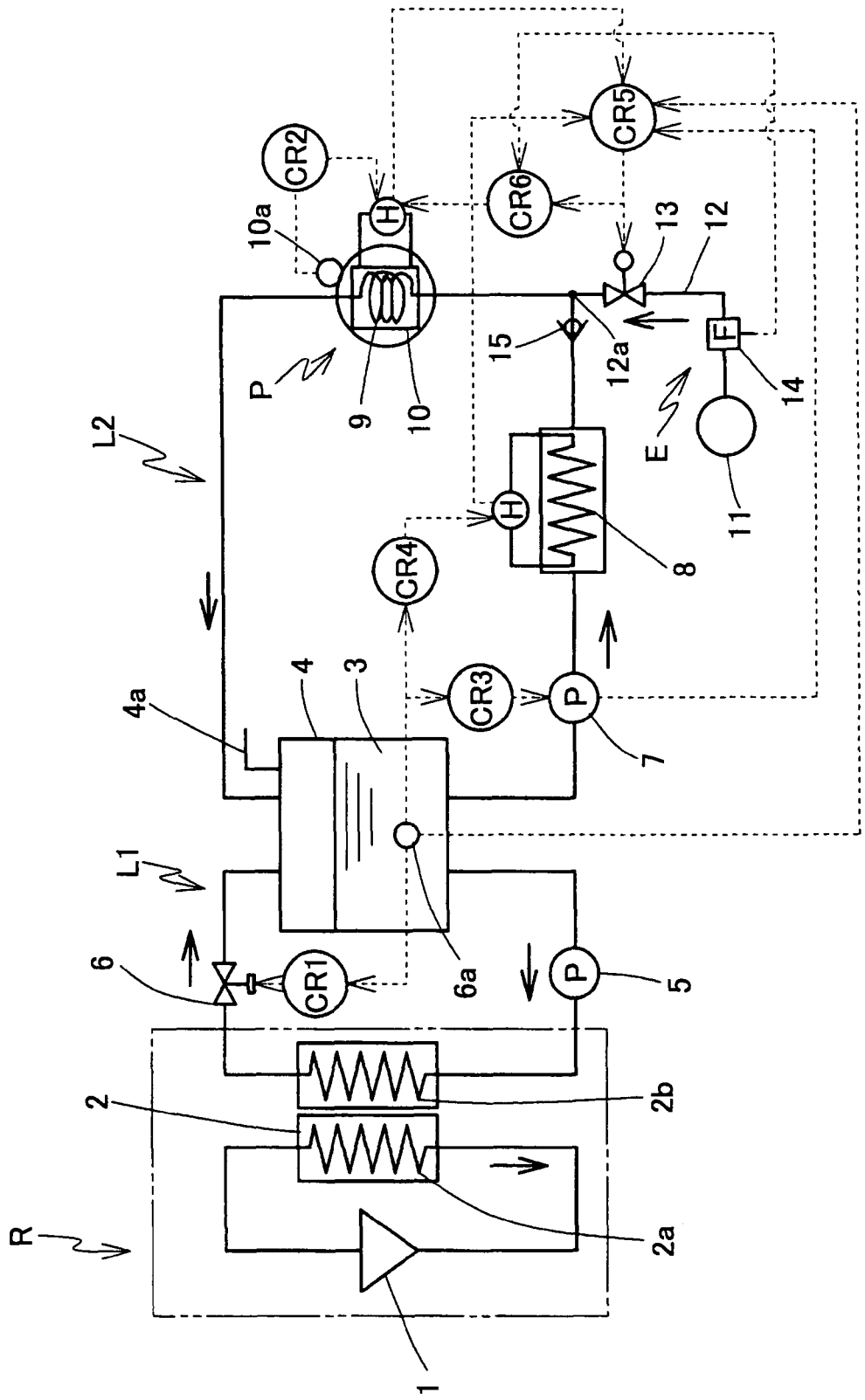
FIG. 2 is a conceptual flow diagram of a temperature controller and a liquid discharger according to an embodiment of the present invention.

A description is given below, with reference to the accompanying drawings, of an embodiment of a liquid discharge method and a liquid discharger in a temperature controller according to the present invention. FIG. 2 is a conceptual flow diagram of the temperature controller and the liquid discharger.

Referring to FIG. 2, the temperature controller includes a heater 10 (hereinafter referred to as "heat transfer plate heater 10") that heats a heat transfer plate P, a refrigerant tank 4 that stores a refrigerant 3, a refrigerator R that cools the refrigerant 3 in the refrigerant tank 4, the heat transfer plate P having its temperature controlled with the refrigerant 3 and the heat transfer plate heater 10, a refrigerant cooling line L1 that circulates the refrigerant 3 between the refrigerant tank 4 and the refrigerator R, and a refrigerant circulation line L2 that circulates the refrigerant 3 between the refrigerant tank 4 and the heat transfer plate P.

The heat transfer plate P includes a refrigerant passage 9 through which the refrigerant 3 of the refrigerant circulation line L2 circulates, and the heat transfer plate heater 10 that heats the heat transfer plate P. The temperature of the heat transfer plate P is controlled in the range of, for example, −70° C. to 200° C. by causing the refrigerant 3 to circulate through the refrigerant passage 9 and heating with the heat transfer plate heater 10. Fluorine-based refrigerants such as Galden (product name) and Fluorinert (product name) are used as the refrigerant 3.

The heat transfer plate heater 10 is formed of, for example, an electrothermal heater. The heat transfer plate heater 10 is controlled based on the temperature detected by a temperature sensor 10a provided at the heat transfer plate P so that the temperature of the heat transfer plate P is equal to a predetermined setpoint. The heat transfer plate heater 10 is controlled with a heat transfer plate heater control part CR2 or other appropriate means such as a resistance temperature sensor described in Patent Document 1 described above. FIG. 2 shows a schematic diagram of the heat transfer plate P, whose specific configuration may be, for example, that shown in Patent Document 2 or 3 described above.

The temperature of the heat transfer plate P thus configured is controlled to equal the predetermined setpoint with the refrigerant 3 circulating in the refrigerant circulation line L2 and the heat transfer plate heater 10 in the case of controlling the temperature of the heat transfer plate P so that the temperature is lower than or equal to room temperature, and is controlled to equal the predetermined setpoint with the heat transfer plate heater 10 in the case of controlling the temperature of the heat transfer plate P so that the temperature is higher than room temperature.

The refrigerator R includes a compressor 1 and a heat exchanger 2. A refrigerant (hereinafter referred to as "refrigerator-side refrigerant") flows from the compressor 1 through the heat exchanger 2 to the compressor 1 in the direction of arrows shown in FIG. 2 in the refrigerator R. The heat exchanger 2 includes a refrigerator-side refrigerant passage 2a through which the refrigerator-side refrigerant flows and a refrigerant passage 2b through which the refrigerant 3 from the refrigerant tank 4 flows. The refrigerant 3 of the refrigerant cooling line L1 flows through this refrigerant passage 2b to be cooled.

The refrigerant tank 4 storing the refrigerant 3 has a substantially hermetic heat insulated structure. According to this embodiment, the upper part of the refrigerant tank 4 is open to the atmosphere through an open-to-atmosphere tube 4a. Further, it is preferable to feed dry air into the upper-part space of the refrigerant tank 4 in order to prevent the refrigerant 3 in the refrigerant tank 4 from absorbing moisture from air in the upper-part space of the refrigerant tank 4 to condense into ice when the temperature of the refrigerant 3 is controlled so that the temperature is lower than or equal to 0° C. Dry air in a dry air feed line (not graphically illustrated) is depressurized to a weak positive pressure with a speed controller (not graphically illustrated) and fed as this dry air. The refrigerant 3 that escapes outside from the refrigerant tank 4 because of evaporation may be collected in a water receptor (not graphically illustrated) provided on the refrigerant tank 4.

The refrigerant cooling line L1 that circulates the refrigerant 3 between the refrigerant tank 4 and the refrigerator R controls the temperature of the refrigerant 3 in the refrigerant tank 4 so that the temperature corresponds to the predetermined setpoint of the heat transfer plate P at the time of controlling the temperature of the heat transfer plate P so that the temperature is lower than or equal to room temperature. The refrigerant cooling line L1 includes the refrigerant passage 2b, the refrigerant tank 4, a circulating pump 5 that pumps the refrigerant 3 in the refrigerant tank 4 into the refrigerant passage 2b, and a flow control valve 6 that controls the flow rate of the refrigerant 3 circulating in the refrigerant cooling line L1. As a result, the refrigerant 3 in the refrigerant tank 4 circulates and flows from the refrigerant tank 4 through the circulating pump 5, the refrigerant passage 2b, and the flow control valve 6 to the refrigerant tank 4.

Like a circulation line pump 7 described below, the circulating pump 5 provided in the refrigerant cooling line L1 stops its operation when the temperature of the refrigerant 3 circulating in the refrigerant circulation line L2 is higher than or equal to a first predetermined temperature described below in the case of changing the setpoint of the heat transfer plate P from a temperature lower than or equal to room temperature to a temperature higher than room temperature, and in the case of controlling the temperature of the heat transfer plate P so that the temperature is higher than room temperature.

The flow control valve 6 provided in the refrigerant cooling line L1 is controlled with a refrigerant temperature sensor 6a provided at the refrigerant tank 4. At the time of controlling the temperature of the heat transfer plate P so that the temperature is lower than or equal to room temperature, the flow control valve 6 controls the flow rate of the refrigerant 3 flowing through the refrigerant passage 2b of the heat exchanger 2, thereby controlling the temperature of the refrigerant 3 in the refrigerant tank 4 to a temperature corresponding to the predetermined setpoint of the heat transfer plate P. This control of the flow control valve 6 with the temperature sensor 6a can be performed with, for example, a flow control valve control part CR1 shown in FIG. 2 or other appropriate means such as a resistance temperature sensor shown in Patent Document 1 described above.

The refrigerant circulation line L2 that controls the temperature of the heat transfer plate P includes the refrigerant passage 9 provided in the heat transfer plate P, the refrigerant tank 4 that stores the refrigerant 3, the circulation line pump 7 that pumps the refrigerant 3 into the refrigerant passage 9 of the heat transfer plate P, and a circulation line heater 8 that heats the refrigerant 3 circulating in the refrigerant circulation line L2. This refrigerant circulation line L2 causes the refrigerant 3 to circulate and flow from the refrigerant tank 4 through the circulation line pump 7, the circulation line heater 8, and the refrigerant passage 9 of the heat transfer plate 9 to the refrigerant tank 4 as indicated by arrows of FIG. 2. The refrigerant circulation line L2 is preferably open to the atmosphere. According to this embodiment, the refrigerant circulation line L2 is open to the atmosphere by making the refrigerant tank 4 open to the atmosphere.

The circulation line pump 7 provided in the refrigerant circulation line L2 stops its operation when the temperature of the refrigerant 3 circulating in the refrigerant circulation line L2 is higher than or equal to the first predetermined temperature in the case of changing the setpoint of the heat transfer plate P from a temperature lower than or equal to room temperature to a temperature higher than room temperature, and in the case of controlling the temperature of the heat transfer plate P so that the temperature is higher than room temperature.

This first predetermined temperature, which is suitably determined based on the type of the refrigerant 103, is set to be lower than or equal to the boiling point of the refrigerant 3. For example, the first predetermined temperature is a few ° C. to tens of ° C., preferably about 10° C. The first predetermined temperature is lower than or equal to the boiling point of the refrigerant 3 in order to perform first-stage liquid discharge while the refrigerant 3 is in a liquid state in the case of performing below-described liquid discharge with air. Further, if the first predetermined temperature is lower than or equal to 0° C., the refrigerant 3 may absorb moisture contained in air to condense into ice in the case of performing liquid discharge with air. Accordingly, it is preferable that the first predetermined temperature be higher than 0° C.

Further, the first predetermined temperature, which may be detected with a temperature sensor provided at a suitable position in the refrigerant circulation line L2, is detected with the refrigerant temperature sensor 6a provided to the refrigerant tank 4 in the case of FIG. 2. Further, the temperature of the heat transfer plate P may be detected with the heat transfer plate temperature sensor 10a, and this detected temperature may be determined as the temperature of the refrigerant 3.

The circulation line heater 8 provided in the refrigerant circulation line L2 is operated to heat the refrigerant 3 circulating in the refrigerant circulation line L2 at the time of changing the setpoint of the heat transfer plate P from a temperature lower than or equal to room temperature to a temperature higher than room temperature. Like the circulation line pump 7, the circulation line heater 8 stops its operation when the temperature of the refrigerant 3 circulating in the refrigerant circulation line L2 is higher than or equal to the first predetermined temperature. The circulation line heater 8 is for raising the temperature of the refrigerant 3 in the refrigerant circulation line L2 at the time of changing the setpoint of the heat transfer plate P from a temperature lower than or equal to room temperature to a temperature higher than room temperature, and does not necessarily have to be provided.

The operations of the circulating pump 5, the circulation line pump 7, and the circulation line heater 8 may be stopped manually by monitoring the display of a temperature sensor provided in the refrigerant circulation line L2 or be stopped automatically based on a signal of the temperature sensor. In the case shown in FIG. 2, the operations are automatically stopped based on a signal of the refrigerant temperature sensor 6a provided at the refrigerant tank 4.

In the case shown in FIG. 2, the refrigerant temperature sensor 6a is electrically connected to a circulation pump control part (not graphically illustrated), a circulation line pump control part CR3, and a circulation line heater control part CR4. In the case of changing the setpoint of the heat transfer plate P from a temperature lower than or equal to room temperature to a temperature higher than room temperature, when the temperature sensor 6a detects the first predetermined temperature, this detection signal is transmitted to each of the circulation pump control part, the circulation line pump control part CR3, and the circulation line heater control part CR4, which then transmit operation stop instruction signals to the circulating pump 5, the circulation line pump 7, and the circulation line heater 8, respectively, so that the operations of the circulating pump 5, the circulation line pump 7, and the circulation line heater 8 are stopped.

In the temperature controller thus configured, in order to solve the above-described problems of the conventional technology, air or an inert gas such as nitrogen is fed into the refrigerant circulation line L2 so as to discharge the refrigerant 3 in the heat transfer plate P in the case of changing the setpoint of the heat transfer plate P from a temperature lower than or equal to room temperature to a temperature higher than room temperature. This discharge of the refrigerant 3, or liquid discharge, is performed at two stages: at a temperature where the refrigerant 3 is in a liquid state and at a temperature where the refrigerant 3 is in a vaporized state. A description is given below of an embodiment of a liquid discharge method and a liquid discharger for discharging a refrigerant.

According to this liquid discharge method for discharging a refrigerant, in the case of changing the setpoint of the heat transfer plate P from a temperature lower than or equal to room temperature to a temperature higher than room temperature, when the temperature of the refrigerant 3 flowing through the refrigerant circulation line L2 has risen to the above-described first predetermined temperature lower than or equal to the boiling point of the refrigerant 3, circulation of the refrigerant 3 flowing through the refrigerant circulation line L2 is stopped, and air is fed from an air feed line 12 into the refrigerant circulation line L2 to flow through the refrigerant passage 9 of the heat transfer plate P, thereby pushing out the refrigerant 3 (in a liquid state) in the refrigerant passage 9. At the same time, the temperature of the heat transfer plate P continues to be raised with the heat transfer plate heater 10, and when the temperature of the heat transfer plate P has risen to a second predetermined temperature above the boiling point of the refrigerant 3, air is again fed from the air feed line 12 into the refrigerant circulation line L2 to flow through the refrigerant passage 9 of the heat transfer plate P, thereby pushing out and discharging the refrigerant 3 (vaporized) remaining in the refrigerant passage 9. It is possible to replace air with an inert gas such as nitrogen.

The above-described second predetermined temperature above the boiling point, which is suitably determined based on the type of the refrigerant 3, is set to a temperature that is above the boiling point of the refrigerant 3 and at which the heated refrigerant 3 remaining in the refrigerant passage 9 of the heat transfer plate P is prevented from being oxidized or generating a poisonous gas. For example, if the refrigerant 3 has a boiling point of 76° C., the refrigerant 3 remaining in the heat transfer plate P may be oxidized or generate a poisonous gas when the temperature of the heat transfer plate P is 150° C. or higher. Therefore, the second predetermined temperature is set to approximately 100° C. in consideration of complete vaporization of the refrigerant 3 in the refrigerant passage 9 as well.

The times for which air is fed into the refrigerant circulation line L2, which are suitably determined, are approximately 1 minute for the first predetermined temperature and approximately 1 to 2 minutes for the second predetermined temperature in the case shown in FIG. 3.

A liquid discharger E that performs this liquid discharge method is configured as an apparatus that causes pressurized air or inert gas such as nitrogen to flow through the refrigerant circulation line L2.

In this embodiment, as shown in FIG. 2, the liquid discharger E includes an air feed source 11, the air feed line 12 for feeding pressurized air from the air feed source 11 to the refrigerant circulation line L2, and a liquid discharge valve 13 that opens and closes the air feed line 12. The air feed line 12 is connected as a branch to the refrigerant circulation line L2 on the upstream side of the refrigerant passage 9, that is, between the refrigerant passage 9 and the circulation line heater 8 (at an air feed line connection point 12a). By opening this liquid discharge valve 13, the pressurized air of the air feed source 11 is fed to the refrigerant circulation line L2 to flow through the refrigerant passage 9.

It is preferable to provide a check valve 15 between the air feed line connection point 12a and the circulation line heater 8 in the refrigerant circulation line L2 in order to prevent the air fed from the air feed source 11 to the refrigerant circulation line L2 from flowing to the side of the circulation line heater 8 and the circulation line pump 7.

As the air feed source 11, various types such as those using an air cylinder and those using a booster pump may be employed. In particular, apparatuses that perform control to low temperatures often employ dry air of pressure approximately 5 kg/cm$^2$ in order to prevent condensation. If the air feed source 11 is allowed to branch from this dry air feed line, there is no need to newly provide an air feed source. Further, an inert gas such as nitrogen may be used in place of air.

As the liquid discharge valve 13, appropriate valves including a manually operated on-off valve may be used but preferably, an electromagnetic valve or a motor-operated valve is employed. In the case of employing an electromagnetic valve or a motor-operated valve, the liquid discharge valve 13 may be remotely operated manually, but it is preferable to provide a liquid discharge valve control part CR5 that controls the electromagnetic valve or motor-operated valve so as to automatically open and close the liquid discharge valve 13. This liquid discharge valve control part CR5 automatically feeds pressurized air from the air feed source 11 to the refrigerant passage 9 so as to discharge the refrigerant 3 in the refrigerant passage 9.

In the embodiment shown in FIG. 2, the liquid discharge valve control part CR5 is electrically connected to the circulation line pump 7, the circulation line heater 8, the heat transfer plate heater 10, and the refrigerant temperature sensor 6a provided at the refrigerant tank 4. In the case of changing the setpoint of the heat transfer plate P from a temperature lower than or equal to room temperature to a temperature higher than room temperature, the liquid discharge valve control part CR5 outputs a first open instruction signal to the liquid discharge valve 13 based on the detection signal of the refrigerant temperature sensor 6a detecting a temperature higher than or equal to the first predetermined temperature, the operation stop signals of the circulation line pump 7 and the circulation line heater 8, and the operation signal of the heat transfer plate heater 10, and opens the liquid discharge valve 13 for a first predetermined period of time; and outputs a second open instruction signal to the liquid discharge valve 13 based on the detection signal of the heat transfer temperature sensor 10a detecting the second predetermined temperature and the operation signal of the heat transfer plate heater 10, and opens the liquid discharge valve 13 for a second predetermined period of time. The operation stop signal of the circulation line heater 8 and the operation signal of the heat transfer plate heater 10 do not necessarily have to be transmitted to the liquid discharge valve control part CR5, and may be omitted.

The first predetermined period of time and the second predetermined period of time for which the liquid discharge valve 13 is open differ depending on the size of the temperature controller, the type of the refrigerant 3, and the amount of feeding of pressurized air. In the case shown in FIG. 3, the first predetermined period of time is approximately 1 minute, and the second predetermined period of time is approximately 1 to 2 minutes.

After the refrigerant temperature sensor 6a detects a temperature higher than or equal to the first predetermined temperature and air is fed once, the liquid discharge valve control part CR5 does not output an open instruction signal to the liquid discharge valve 13 until the heat transfer plate temperature sensor 10a detects the second predetermined temperature even though the refrigerant temperature sensor 6a is detecting a temperature higher than or equal to the first predetermined temperature. Further, after the heat transfer plate temperature sensor 10a detects the second predetermined temperature and air is fed once, the liquid discharge valve control part CR5 does not output an open instruction signal to the liquid discharge valve 13 even though the heat transfer plate temperature sensor 10a is detecting a temperature higher than or equal to the second predetermined temperature.

Further, in the case of changing the setpoint of the heat transfer plate P from a temperature higher than room temperature to a temperature lower than or equal to room temperature, the circulation line pump 7 is in operation, so that even if the temperature sensor 6a detects the first predetermined temperature or the heat transfer plate temperature sensor 10a detects the second predetermined temperature, the liquid discharge valve control part CR5 is prevented from opening the liquid discharge valve 13. That is, in this case, the liquid discharger E does not operate.

Further, it is preferable to automatically stop the operation of the heat transfer plate heater 10 in order to prevent the temperature of the refrigerant 3 in the refrigerant passage 9 of the heat transfer plate P from rising if no pressurized air is fed to the refrigerant circulation line L2 at the time of liquid discharge because there is no pressurized air in the air feed source 11 or the liquid discharge valve 13 does not open.

Therefore, a part that automatically stops the heat transfer plate heater 10 (hereinafter referred to as "heat transfer plate heater stop unit") is provided in the embodiment shown in FIG. 2. The heat transfer plate heater stop unit includes a flow switch 14 provided in the air feed line 12. If the flow switch 14 does not detect feeding of air at the time of liquid discharge, a heat transfer plate heater stop control part CR6 automatically stops the operation of the heat transfer plate heater 10.

The flow switch 14 and the liquid discharge valve control part CR5 are electrically connected to the heat transfer plate heater stop control part CR6. Even if the heat transfer plate heater stop control part CR6 receives the first open instruction signal or the second open instruction signal from the liquid discharge valve control part CR5, the heat transfer plate heater stop control part CR6 transmits an operation stop instruction signal to the heat transfer plate heater 10 to stop the operation of the heat transfer plate heater 10 if not receiving an operation signal from the flow switch 14.

The flow switch 14 may be provided between the air feed line connection point 12a and the liquid discharge valve 13.

The above-described control parts such as the flow control valve control part CR1, the heat transfer plate heater control part CR2, the circulating pump control part, the circulation line pump control part CR3, the circulation line heater control part CR4, the liquid discharge valve control part CR5, and the heat transfer plate heater stop control part CR6 may be configured in an appropriate controller (not graphically illustrated), for which it is preferable to employ a controller (not graphically illustrated) existing in the refrigerator R.

Next, a description is given of operations of the temperature controller of FIG. 2 having the liquid discharger E. The operation in the case of controlling the temperature of the heat transfer plate P so that the temperature is lower than or equal to room temperature is the same as in the above-described conventional case, and a description thereof is not given in detail. The refrigerator R and the circulating pump 5 are operated to circulate the refrigerant 3 in the refrigerant tank 4 in the refrigerant cooling line L1, so that the temperature of the refrigerant 3 in the refrigerant tank 4 is controlled to correspond to the predetermined setpoint of the heat transfer plate P, for example, a temperature lower than the setpoint of the heat transfer plate P by a few ° C. At the same time, the circulation line pump 7 is operated to pump the refrigerant 3 in the refrigerant tank 4 into the refrigerant passage 9 provided in the heat transfer plate P, so that the temperature of the heat transfer plate P is controlled to equal the predetermined setpoint with this refrigerant 3 and the heat transfer plate heater 10 provided in the heat transfer plate P.

In the case of controlling the temperature of the heat transfer plate P so that the temperature is higher than room temperature, the circulation line pump 7 is not operated, that is, circulation of the refrigerant 3 in the refrigerant circulation line L2 is stopped, and the heat transfer plate heater 10 is controlled based on the temperature detected by the heat transfer plate temperature sensor 10a so that the temperature of the heat transfer plate P equals the setpoint. In this case, the refrigerant 3 does not exist in the refrigerant passage 9 of the heat transfer plate P because of liquid discharge described below.

A description is given below of the case of changing the setpoint of the heat transfer plate P from a temperature lower than or equal to room temperature to a temperature higher than room temperature, for example, from −40° C. to 200° C., and performing temperature control. The boiling point of the refrigerant 3 is 76° C., the first predetermined temperature is 10° C., and the second predetermined temperature is 100° C.

When the setpoint of the heat transfer plate P is changed from −40° C. to 200° C., this change is detected by a detection part (not graphically illustrated). At the same time, the circulation line pump 7, the circulation line heater 8, and the heat transfer plate heater 10 are operated, so that the temperature of the refrigerant 3 circulating in the refrigerant circulation line L2 rises. At this point, the circulating pump 5 of the refrigerant cooling line L1 may be operated or stopped.

When the temperature of the refrigerant 3 in the refrigerant tank 4 thus rises to reach the first predetermined temperature of 10° C. (while the refrigerant 3 remains liquid), the refrigerant temperature sensor 6a detects this first predetermined temperature, and this detection signal is transmitted to the circulation line pump control part CR3 and the circulation line heater control part CR4. Since the change of the setpoint of the heat transfer plate P from −40° C. to 200° C. has already been detected, the circulation line pump control part CR3 and the circulation line heater control part CR4 transmit operation stop instruction signals to the circulation line pump 7 and the circulation line heater 8, respectively, based on this detection signal of the first predetermined temperature so as to stop their operations. If the circulating pump 5 of the refrigerant cooling line L1 has been operated, this operation is also stopped by the circulating pump control part in the same manner.

This detection signal of the refrigerant temperature sensor 6a is also transmitted to the liquid discharge valve control part CR5. Based on the signal from the refrigerant temperature sensor 6a, an operation signal from the heat transfer plate heater 10, and operation stop signals from the circulation line pump 7 and the circulation line heater 8, the liquid discharge valve control part CR5 outputs a first open instruction signal to the liquid discharge valve 13 so as to open the liquid discharge valve 13 for a first predetermined period of time, for example, approximately 1 minute, thereby feeding air from the air feed source 11 to the refrigerant circulation line L2 through the air feed line 12 so as to push out the refrigerant 3 in a liquid state in the refrigerant passage 9 back to the refrigerant tank 4.

At the same time, the temperature of the heat transfer plate P is further raised by the operation of the heat transfer plate heater 10. When the temperature of the heat transfer plate P rises to the second predetermined temperature of 100° C. (where the refrigerant 3 is vaporized), the heat transfer plate temperature sensor 10a detects this temperature, and transmits this detection signal to the liquid discharge valve control part CR5. Based on this signal from the heat transfer plate temperature sensor 10a and the operation signal of the heat transfer plate P, the liquid discharge valve control part CR5 outputs a second open instruction signal to the liquid discharge valve 13 so as to open the liquid discharge valve for a second predetermined period of time, for example, approximately 1 to 2 minutes, thereby feeding air from the air feed source 11 to the refrigerant circulation line L2 through the air feed line 12 so as to push out the refrigerant 3 (vaporized) remaining in the refrigerant passage 9 back to the refrigerant tank 4.

The above-described first open instruction signal and second open instruction signal are also transmitted to the heat transfer plate heater stop control part CR6 of the heat transfer plate heater stop unit. At this point, if the flow switch 14 transmits a signal that indicates that the flow switch 14 is not in operation to the heat transfer plate heater stop control part CR6, then, based on the first open instruction signal, the second open instruction signal, and the signal indicating that the flow switch 14 is not in operation, the heat transfer plate heater stop control part CR6 transmits an operation stop instruction signal to the heat transfer plate heater 10 so as to automatically stop the operation of the heat transfer plate heater 10, thereby stopping controlling the temperature of the heat transfer plate P.

When the liquid discharge ends, the temperature of the heat transfer plate P is raised to its setpoint of 200° C. with the heat transfer plate heater 10, and thereafter, the heat transfer plate heater 10 controls the temperature of the heat transfer plate P so that the temperature equals the setpoint of 200° C. based on the temperature detected by the heat transfer plate temperature sensor 10a.

In the case of changing the setpoint of the heat transfer plate P from a temperature lower than or equal to room temperature and higher than the first predetermined temperature of 10° C. to a temperature of 200° C. higher than room temperature, the temperature detected by the refrigerant temperature sensor 6a has already exceeded the first predetermined temperature. Accordingly, the operation of the circulation line pump 7 may be stopped, and as described above, air may be fed from the air feed line 12 to the refrigerant circulation line L2 so as to discharge the refrigerant 3 in a liquid state in the refrigerant passage 9. Thereafter, when the temperature of the heat transfer plate P has risen to the second predetermined temperature of 100° C., air may be fed from the air feed line 12 to the refrigerant circulation line L2 so as to discharge the vaporized refrigerant 3 remaining in the refrigerant passage 9 as described above.

Further, in the case of changing the setpoint of the heat transfer plate P from a temperature lower than or equal to the first predetermined temperature 10° C. to a room temperature higher than 10° C., the liquid discharger E is not put into operation and the temperature of the heat transfer plate P is controlled with the refrigerant 3 and the heat transfer plate heater 10 because there is no exceeding of room temperature in this change.

Further, in the case of manually operating the liquid discharge valve 13, the stopping of the operations of the circulating pump 5, the circulation line pump 7, and the circulation line heater 8 and the opening and closing of the liquid discharge valve 13 may be manually performed in the above-described procedure while monitoring the display of the temperature sensor 10a provided at the heat transfer plate P. If the flow switch 14 does not work at the time of liquid discharge, the heat transfer plate heater stop unit automatically stops the operation of the heat transfer plate heater 10.

According to the liquid discharge method and the liquid discharger E in the temperature controller of this embodiment, in the case of changing the setpoint of the heat transfer plate P from a temperature lower than or equal to room temperature to a temperature higher than room temperature, circulation of the refrigerant 3 in the refrigerant circulation line L2 is stopped and pressurized air is caused to flow in the refrigerant passage 9 when the temperature of the heat transfer plate P (the refrigerant 3) has risen to the first predetermined temperature lower than or equal to the boiling point of the refrigerant 3. Accordingly, the refrigerant 3 remaining in the refrigerant passage 9 is in a liquid state, so that most of the refrigerant 3 in the refrigerant passage 9 can be pushed out of the refrigerant passage 9 in a short time with the pressurized air.

Further, pressurized air is again caused to flow in the refrigerant passage 9 when the temperature of the heat transfer plate P has risen to the second predetermined temperature higher than the boiling point of the refrigerant 3. Accordingly, a remaining small amount of the refrigerant 3, which has not been able to be completely discharged by the above-described liquid discharge in its liquid state, is vaporized, and this vaporized refrigerant 3 can be pushed out completely with the pressurized air. Therefore, it is possible to discharge all the refrigerant 3 in the refrigerant passage 9.

FIG. 3 shows specific examples of one or more effects of the above-described liquid discharge. FIG. 3 shows a comparison in a test using a refrigerant having a boiling point of 76° C. When the temperature of the heat transfer plate P, that is, the temperature of the refrigerant, is 10° C., the refrigerant remains liquid, and even when the liquid discharge valve 13 is opened to feed pressurized air to the refrigerant passage 9 for 1 minute, 3 minutes, and 5 minutes, amounts of 11.0 g, 1.0 g, and 0.8 g, respectively, of the refrigerant remain in the refrigerant passage 9 as residual liquid. Thus, the refrigerant cannot be discharged completely. However, by opening the liquid discharge valve 13 and feeding pressurized air for 1 minute when the temperature of the heat transfer plate P is 10° C., and again opening the liquid discharge valve 13 and feeding pressurized air to the refrigerant passage 9 for 1 minute and 2 minutes, respectively, when the temperature of the heat transfer plate P is 100° C. (where the refrigerant is vaporized), the amount of residual liquid is 0.0 g in each case, thus showing that the refrigerant in the refrigerant passage 9 is completely discharged.

Thus, by performing liquid discharge at two stages, even in the heat transfer plate P having the complicated refrigerant passage 9 formed therein, it is possible to completely discharge the refrigerant 3 remaining in the refrigerant passage 9 in a short period of time. Therefore, according to this embodiment, in the case of controlling the heat transfer plate P to high temperature, since there is no refrigerant 3 in the refrigerant passage 9, problems such as generation of a poisonous gas by the refrigerant 3 and oxidation and evaporation of the refrigerant 3 are eliminated. Accordingly, it is possible to use a refrigerant that yields high performance in a low-temperature range (at or below 0° C.), so that it is possible to widen the range of selection of refrigerant to be used. Further, it is also possible to reduce cooling time and increase refrigeration capacity.

In the case of controlling the temperature of the heat transfer plate P so that the temperature is higher than room temperature, since there is no refrigerant 3 in the refrigerant passage 9, the thermal capacity of the heat transfer plate P does not increase, so that it is possible to reduce time for raising the temperature of the heat transfer plate P.

Further, according to this embodiment, the flow switch 14 is provided to the refrigerant circulation line L2. As a result, in the case of changing the setpoint of the heat transfer plate P from a low temperature to a high temperature, if there is no feeding of pressurized air although the temperature sensors 6a and 10a detect the first predetermined temperature and the second predetermined temperature, respectively, the flow switch 14 detects this lack of feeding so as to stop the operation of the heat transfer plate heater 10, thereby preventing the temperature of the heat transfer plate P from rising with the refrigerant 3 remaining in the refrigerant passage 9. Accordingly, it is possible to prevent a problem in that the temperature of the heat transfer plate P inadvertently rises to cause the refrigerant to be evaporated, oxidized, or generate a poisonous gas, so that it is possible to ensure safety.

Further, according to this embodiment, the refrigerant circulation line L2 is open to the atmosphere. Accordingly, it is possible to smoothly discharge the refrigerant 3 in the refrigerant passage 9 up to the refrigerant tank 4 at the time of liquid discharge. Further, the check valve 15 is provided in the refrigerant circulation line L2. Accordingly, at the time of discharging the refrigerant 3, all pressurized air flows to the refrigerant passage 9 without flowing to the refrigerant tank 4 side through the circulation line heater 8 and the circulation line pump 7, so that it is possible to discharge the refrigerant 3 with efficiency.

According to one aspect of the present invention, there is provided a liquid discharge method in a temperature controller having a refrigerant circulation line circulating a refrigerant to a target of temperature control and a heater heating the target, wherein the refrigerant is circulated so as to control the temperature of the target with the refrigerant and the heater in the case where the temperature of the target is controlled to be a first temperature lower than or equal to a room temperature, wherein the circulation of the refrigerant is stopped so as to control the temperature of the target with the heater in the case where the temperature of the target is controlled to be a second temperature higher than the room temperature, wherein in the case of changing the setpoint of the target from the first temperature to the second temperature, when the temperature of the refrigerant rises to reach a first predetermined temperature lower than or equal to a boiling point of the refrigerant, the circulation of the refrigerant is stopped, one of air and an inert gas is fed to the refrigerant circulation line so as to discharge the refrigerant in the target, and simultaneously, the temperature of the target continues to be raised with the heater; and when the temperature of the target rises to reach a second predetermined temperature higher than the boiling point of the refrigerant, the one of the air and the inert gas is again fed to the refrigerant circulation line so as to discharge the refrigerant remaining in the target.

Additionally, in the above-described liquid discharge method, when the one of the air and the inert gas is not fed to the refrigerant circulation line, the lack of feeding of the one of the air and the inert gas may be detected and the operation of the heater is stopped.

According to one aspect of the present invention, there is provided a liquid discharger in a temperature controller having a refrigerant circulation line circulating a refrigerant to a target of temperature control and a heater heating the target, wherein the refrigerant is circulated so as to control the temperature of the target with the refrigerant and the heater in the case where the temperature of the target is controlled to be a first temperature lower than or equal to a room temperature, wherein the circulation of the refrigerant is stopped so as to control the temperature of the target with the heater in the case where the temperature of the target is controlled to be a second temperature higher than the room temperature, the liquid discharger including an air feed line connected to the refrigerant circulation line, wherein in the case of changing the setpoint of the target from the first temperature to the second temperature, when the temperature of the refrigerant rises to reach a first predetermined temperature lower than or equal to the boiling point of the refrigerant, the circulation of the refrigerant is stopped, one of air and an inert gas is fed from the air feed line to the refrigerant circulation line so as to discharge the refrigerant in the target, and simultaneously, the temperature of the target continues to be raised with the heater; and when the temperature of the target rises to reach a second predetermined temperature higher than the boiling point of the refrigerant, the one of the air and the inert gas is again fed from the air feed line to the refrigerant circulation line so as to discharge the refrigerant remaining in the target.

Additionally, the above-described liquid discharger may further include a part configured to detect, when the one of the air and the inert gas is not fed to the refrigerant circulation line, the lack of feeding of the one of the air and the inert gas and to stop the operation of the heater.

The above-described liquid discharge method and liquid discharger act as follows. In the case of changing the setpoint of the target of temperature control from a temperature lower than room temperature to a temperature higher than room temperature, a refrigerant in a refrigerant circulation line is circulated, and a heater provided in the target is operated to raise the temperatures of the refrigerant and the target. When the temperature of this circulating refrigerant has risen to a first predetermined temperature lower than or equal to the boiling point of the refrigerant, circulation of the refrigerant is stopped, and air or an inert gas such as nitrogen is caused to flow from an air feed line to the refrigerant circulation line so as to push the refrigerant in a liquid state in the target out of the target, thereby returning most of the refrigerant in the target to a refrigerant tank provided in the refrigerant circulation line.

At the same time, the temperature of the target continues to be raised with the heater provided in the target, and when the temperature of the target has risen to a second predetermined temperature higher than the boiling point of the refrigerant, so that the refrigerant remaining in the target is vaporized, air or an inert gas such as nitrogen is again caused to flow from the air feed line to the refrigerant circulation line so that the vaporized refrigerant remaining in the target is pushed out of the target to be collected in the refrigerant tank, thereby completely discharging the refrigerant in the target. Then, the temperature of the target is further raised with the heater provided in the target, and the temperature of the target is controlled to equal the setpoint with the heater.

Further, according to the above-described liquid discharge method and liquid discharger, in the case of changing the setpoint of the target from a temperature lower than or equal to room temperature to a temperature higher than room temperature, if air or an inert gas such as nitrogen is not fed from an air feed line into a refrigerant passage provided in the target although the temperature of the target has risen to the first predetermined temperature lower than or equal to the boiling point of the refrigerant or the second predetermined temperature higher than the boiling point, this is detected so as to stop the operation of the heater heating the target, thereby preventing the temperature of the refrigerant remaining in the target from being inadvertently raised with the heater.

Thus, according to a liquid discharge method and a liquid discharger in a temperature controller according to one embodiment of the present invention, in the case of changing the setpoint of a target of temperature control from a temperature lower than or equal to room temperature to a temperature higher than room temperature, it is possible to remove all of a refrigerant in the target by performing liquid discharge at two stages: stopping circulation of the refrigerant in a refrigerant circulation line and causing air or an inert gas such as nitrogen to flow through the refrigerant circulation line so as to discharge the refrigerant in a liquid state in the target when the temperature of the target has risen to a first predetermined temperature lower than or equal to the boiling point of the refrigerant; and thereafter, again causing air or an inert gas such as nitrogen to flow through the refrigerant circulation line so as to discharge the vaporized refrigerant remaining in the target when the temperature of the target has risen to a second predetermined temperature higher than the boiling point of the refrigerant. Therefore, at the time of controlling the temperature of the target to high temperature, the refrigerant is prevented from being evaporated, oxidized, or generating a poisonous gas. Further, it is possible to control a refrigerant that yields high performance in a low-temperature range to high temperature, so that it is possible to widen the range of selection of refrigerants to be used, and to reduce cooling time and increase refrigeration capacity.

Further, if there is no feeding of air or an inert gas such as nitrogen from an air feed line into the refrigerant circulation line, this is detected and the operation of a heater provided in the target is stopped. This prevents the temperature of the refrigerant in the refrigerant circulation line from rising inadvertently, so that it is possible to prevent the refrigerant from being evaporated, oxidized, or generating a poisonous gas.

The present invention is not limited to the specifically disclosed embodiment, and variations and modifications may be made without departing from the scope of the present invention. For example, the liquid discharge method and the liquid discharger in the temperature controller of the present invention are also applicable to apparatuses that circulate fluid, such as refrigerators and compressors. Further, the refrigerant circulation line is not limited to the one of the above-described embodiment, and may also be an appropriate circulation line.

The liquid discharge valve control part is not limited to the one of the above-described embodiment, and may be of any system as long as it allows implementation of the liquid discharge method of the present invention. Further, the control parts such as the circulating pump control part and the heat transfer plate heater control part may be of any system as long as they can perform the above-described control.

The present application is based on Japanese Priority Patent Application No. 2006-184378, filed on Jul. 4, 2006, the entire contents of which are hereby incorporated by reference.

The invention claimed is:

1. A liquid discharge method in a temperature controller having a refrigerant circulation line circulating a refrigerant to a target of temperature control and a heater heating the target, wherein the refrigerant is circulated so as to control a temperature of the target with the refrigerant and the heater in a case where the temperature of the target is controlled to be a first temperature lower than or equal to a room temperature, wherein the circulation of the refrigerant is stopped so as to control the temperature of the target with the heater in a case where the temperature of the target is controlled to be a second temperature higher than the room temperature, wherein:
in a case of changing a setpoint of the target from the first temperature to the second temperature, when a temperature of the refrigerant rises to reach a first predetermined temperature lower than or equal to a boiling point of the refrigerant, the circulation of the refrigerant is stopped, one of air and an inert gas is fed to the refrigerant circulation line so as to discharge the refrigerant in the target, and simultaneously, the temperature of the target continues to be raised with the heater; and when the temperature of the target rises to reach a second predetermined temperature higher than the boiling point of the refrigerant, the one of the air and the inert gas is again fed to the refrigerant circulation line so as to discharge the refrigerant remaining in the target.

2. The liquid discharge method as claimed in claim 1, wherein when the one of the air and the inert gas is not fed to the refrigerant circulation line, the lack of feeding of the one of the air and the inert gas is detected and an operation of the heater is stopped.

3. The liquid discharge method as claimed in claim 1, wherein the one of the air and the inert gas is fed to the refrigerant circulation line from an air feed line connected thereto.

4. The liquid discharge method as claimed in claim 1, wherein the inert gas is nitrogen gas.

5. A liquid discharger in a temperature controller having a refrigerant circulation line circulating a refrigerant to a target of temperature control and a heater heating the target, wherein the refrigerant is circulated so as to control a temperature of the target with the refrigerant and the heater in a case where the temperature of the target is controlled to be a first temperature lower than or equal to a room temperature, wherein the circulation of the refrigerant is stopped so as to control the temperature of the target with the heater in a case where the temperature of the target is controlled to be a second temperature higher than the room temperature, the liquid discharger comprising:
an air feed line connected to the refrigerant circulation line,
wherein in a case of changing a setpoint of the target from the first temperature to the second temperature, when a temperature of the refrigerant rises to reach a first predetermined temperature lower than or equal to a boiling point of the refrigerant, the circulation of the refrigerant is stopped, one of air and an inert gas is fed from the air feed line to the refrigerant circulation line so as to discharge the refrigerant in the target, and simultaneously, the temperature of the target continues to be raised with the heater; and when the temperature of the target rises to reach a second predetermined temperature higher than the boiling point of the refrigerant, the one of the air and the inert gas is again fed from the air feed line to the refrigerant circulation line so as to discharge the refrigerant remaining in the target.

6. The liquid discharger as claimed in claim 5, further comprising a part configured to detect, when the one of the air and the inert gas is not fed from the air feed line to the refrigerant circulation line, the lack of feeding of the one of the air and the inert gas from the air feed line to the refrigerant circulation line and to stop an operation of the heater.

7. The liquid discharger as claimed in claim 5, wherein the inert gas is nitrogen gas.

* * * * *

UNITED STATES PATENT AND TRADEMARK OFFICE
CERTIFICATE OF CORRECTION

| | | |
|---|---|---|
| PATENT NO. | : 7,870,757 B2 | Page 1 of 1 |
| APPLICATION NO. | : 11/794864 | |
| DATED | : January 18, 2011 | |
| INVENTOR(S) | : Akihito Yanagida et al. | |

It is certified that error appears in the above-identified patent and that said Letters Patent is hereby corrected as shown below:

On the Title Page of the Patent, Abstract should read:

A liquid discharger and corresponding method includes an air feed line connected to a refrigerant circulation line. When changing a setpoint of a target, when a temperature of the refrigerant rises to reach a first predetermined temperature lower than or equal to a boiling point of the refrigerant, the circulation of the refrigerant is stopped, one of air and an inert gas is fed from an air feed line to the refrigerant circulation line so as to discharge the refrigerant in a target, and simultaneously, the temperature of the target continues to be raised with a heater. When the temperature of the target rises to reach a second predetermined temperature higher than the boiling point of the refrigerant, the one of the air and inert gas is again fed from the air feed line to the refrigerant circulation line so as to discharge the refrigerant remaining in the target.

Signed and Sealed this
Twenty-fifth Day of October, 2011

David J. Kappos
*Director of the United States Patent and Trademark Office*